United States Patent [19]

Effenberger et al.

[11] Patent Number: 5,141,800
[45] Date of Patent: Aug. 25, 1992

[54] METHOD OF MAKING LAMINATED PTFE-CONTAINING COMPOSITES AND PRODUCTS THEREOF

[75] Inventors: John A. Effenberger, Bedford; Francis M. Enzien, Penacook, both of N.H.; Frank M. Keese, Cambridge, N.Y.; Keith G. Koerber, Goffstown, N.H.

[73] Assignee: Chemical Fabrics Corporation, Merrimack, N.H.

[21] Appl. No.: 719,689

[22] Filed: Jun. 25, 1991

Related U.S. Application Data

[63] Continuation of Ser. No. 305,748, Feb. 2, 1989, abandoned.

[51] Int. Cl.$^5$ ............... B32B 27/08; B32B 15/08; B32B 27/32; B32B 27/34
[52] U.S. Cl. .................. 428/267; 428/268; 428/422; 428/457; 428/463; 428/516
[58] Field of Search .............. 428/421, 422, 245, 252, 428/267, 268, 457, 463, 516; 156/372.6, 306.9, 83; 264/127

[56] References Cited

U.S. PATENT DOCUMENTS

| | | | |
|---|---|---|---|
| 2,710,820 | 6/1955 | Hilborn et al. | 156/239 |
| 2,852,811 | 9/1958 | Petriello | 264/127 X |
| 3,075,939 | 1/1963 | Bauer, Jr. et al. | 524/501 |
| 3,136,680 | 6/1964 | Hochberg | 156/333 |
| 3,168,426 | 2/1965 | Blackie | 156/306.9 |
| 3,304,216 | 2/1967 | Eggleton | 156/283 |
| 3,304,221 | 2/1967 | Eggleton | 428/422 |
| 3,455,774 | 7/1969 | Lindsey et al. | 156/306.9 |
| 3,849,243 | 11/1974 | Grot | 428/421 |
| 3,850,674 | 11/1974 | Clarke, Jr. et al. | 428/422 X |
| 4,165,404 | 8/1979 | Quehl | 428/422 X |
| 4,549,921 | 10/1985 | Wolfe, Jr. | 156/272.6 |
| 4,610,918 | 9/1986 | Effenberger et al. | 428/245 |
| 4,615,933 | 10/1986 | Traut | 428/422 |
| 4,740,340 | 4/1988 | Pratt et al. | 264/127 X |
| 4,770,927 | 9/1988 | Effenberger et al. | 428/252 |

FOREIGN PATENT DOCUMENTS 997096  6/1965  United Kingdom ............... 428/422

*Primary Examiner*—Thomas J. Herbert, Jr.
*Attorney, Agent, or Firm*—White & Case

[57] ABSTRACT

Dispersion polymerized PTFE itself, if provided in an unfused state, is sufficiently capable of acting as a pressure sensitive adhesive to facilitate the formation of an initial mechanical bond between components of a laminate such that it may be subsequently heat treated in a relatively short period of time to produce a well-bonded final laminate. This fact makes it possible to prepare a laminate comprising at least one layer containing PTFE by the steps of:

(a) preparing a first dimensionally stable laminate component having two major surfaces, at least one of said major surfaces having an exposed layer comprising unfused PTFE;

(b) preparing a second dimensionally stable laminate component having two major surfaces, at least a first of said major surfaces being capable of forming an integral bond with the unfused PTFE-containing layer;

(c) bringing said first and second laminate components together so that the exposed layer comprising unfused PTFE and the surface bondable with the unfused PTFE-containing layer are in contact with each other;

(d) applying pressure to the combined laminate components at moderate temperature to achieve intimate contact and form a mechanical bond between the first and second laminate components;

(e) introducing the mechanically bonded to a heating zone under conditions which avoid delamination; and (f) sintering the mechanically bonded laminate components in a heating zone to consolidate the unfused PTFE-containing layer. The mechanical bond formed is sufficiently strong that the consolidation can be done in a free-sintering process (no applied pressure). Application of pressure, however, is generally not detrimental to the product.

33 Claims, 5 Drawing Sheets

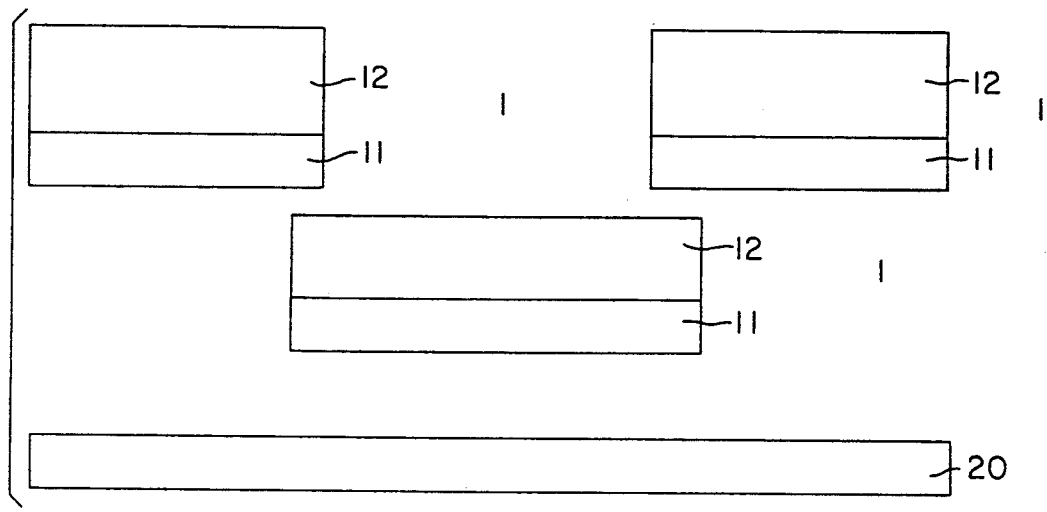
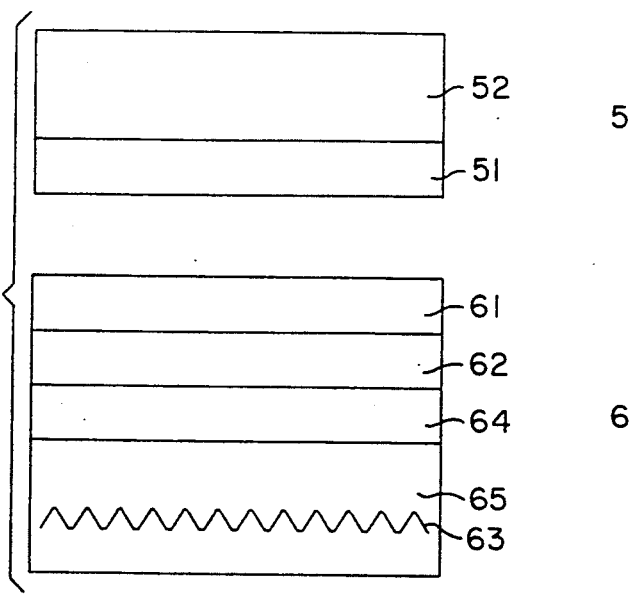

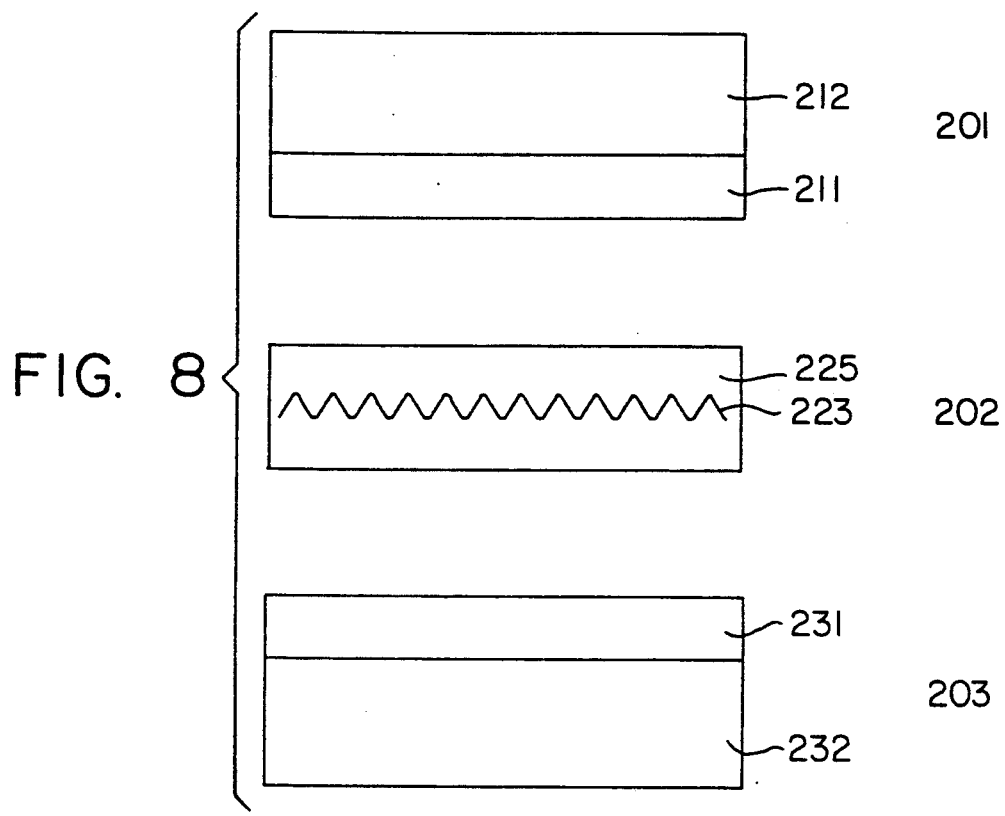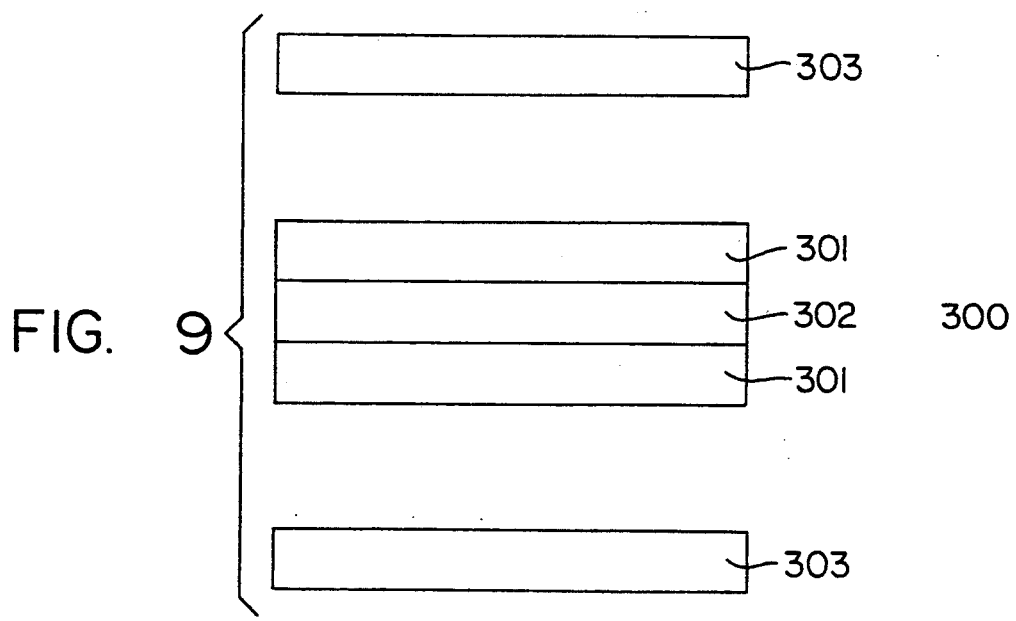

METHOD OF MAKING LAMINATED PTFE-CONTAINING COMPOSITES AND PRODUCTS THEREOF

This application is a continuation of application Ser. No. 07/305,748, filed on Feb. 2, 1989, now abandoned.

BACKGROUND OF THE INVENTION

The present invention relates to a method of making composites which incorporate polytetrafluoroethylene (PTFE) and to a method for applying a PTFE coating to preformed materials, and to the products of these methods.

Since its discovery, PTFE has been found to be useful in a wide variety of applications including cookware, protective garments, architectural fabrics, circuit boards and expansion joints. These materials have been frequently made by repeatedly dip coating or spraying a substrate with a dispersion of PTFE to build up a coating having the desired thickness. Dip-coating, however, has inherent limitations in the types of products that can be made. For example, a dip coated product always has an internal substrate capable of withstanding the high temperature of polymer fusion and consolidation. This defines a minimum thickness of any given product, and further may impact upon the physical properties of the product. Spray coating has the disadvantage of material loss through over-spray.

Other approaches to the preparation of PTFE-containing materials have involved the separate formation of coating films, in some cases multi-layer coatings, and the subsequent application of these coating to a substrate. For example, European Patent Publication No. 0159942 describes lamination as a method for making fluoropolymer composites; U.S. Pat. No. 3,136,680 to Hochberg describes a PTFE/copper laminate; U.S. Pat. No. 4,610,918 to Effenberger et al. describes wear resistant fluoropolymer composites which may be separately formed as films for subsequent combination with a substrate; U.S. Pat. No. 4,770,927 to Effenberger et al. describes reinforced fluoropolymer composites which may be formed in part by lamination or decalcomania type transfer of a separately formed film onto a substrate; U.S. Pat. No. 3,455,774 to Lindsey et al. describes a process for joining fluoropolymer films to polyimide films which involves surface modification of the fluoropolymer with an electrical discharge; and U.S. Pat. No. 3,304,221 to Eggleton which discloses lamination of PTFE films to a metal surface using an interlayer of dry particulate PTFE. In each of these disclosures, however, the laminate is formed by the simultaneous application of high temperature and pressure.

Laminates of fluoropolymers have also been formed using various types of adhesive compositions. For example, U S. Pat. No. 4,549,921 to Wolfe, Jr. describes a copolymer of vinylidene fluoride and hexafluoropropylene containing a diisocyanate cure site for use in joining several fluorinated copolymer films at pressures of 8-12 psi and 150° C. to 175° C. for at least 1.5 minutes. This technique requires preliminary treatment of the fluoropolymer film surface with a corona discharge, and further involves the incorporation of more thermally or oxidatively unstable materials in the laminate to achieve bonding.

U.S. Pat. No. 3,850,674 to Clarke, Jr. et al. describes applying a room-temperature curable copolymer or terpolymer coating composition for application to fiberglass laminates. These coatings have cross-linking sites which allow them to interact with a primer which is applied to the fiberglass substrate.

SUMMARY OF THE INVENTION

It has now been surprisingly found that dispersion polymerized PTFE itself, if provided in an unfused state, is sufficiently capable of acting as a pressure sensitive adhesive to facilitate the formation of an initial mechanical bond between components of a laminate such that it may be subsequently heat treated in a relatively short period of time to produce a well-bonded final laminate. This fact makes it possible to prepare a laminate comprising at least one layer containing PTFE by the steps of:

(a) preparing a first dimensionally stable laminate component having two major surfaces, at least one of said major surfaces having an exposed layer comprising unfused PTFE;

(b) preparing a second dimensionally stable laminate component having two major surfaces, at least a first of said major surfaces being capable of forming an integral bond with the unfused PTFE-containing layer;

(c) bringing said first and second laminate components together so that the exposed layer comprising unfused PTFE and the surface bondable with the unfused PTFE-containing layer are in contact with each other;

(d) applying pressure to the combined laminate components at moderate temperature to achieve intimate contact and form a mechanical bond between the first and second laminate components;

(e) introducing the mechanically bonded laminate to a heating zone under conditions which do not cause delamination; and (f) sintering the mechanically bonded laminate components in the healing zone to consolidate the unfused PTFE-containing layer. The mechanical bond formed is sufficiently strong that the consolidation can be done in a free-sintering process (no applied pressure). Application of pressure, however, is generally not detrimental to the product.

In a preferred embodiment, both of the laminate components will have an exposed unfused-PTFE containing layer, and these layers will be placed in contact to form the laminate.

BRIEF DESCRIPTION OF THE DRAWINGS

FIG. 3 shows the laminate components used to prepare an exemplary composite using the method of the invention.

FIG. 4 shows the laminate components used to prepare an exemplary composite using the method of the invention.

FIG. 8 shows the laminate components used to prepare an exemplary composite using the method of the invention.

FIG. 9 shows the laminate components used to prepare an exemplary composite using the method of the invention.

DETAILED DESCRIPTION OF THE INVENTION

Figure 1:
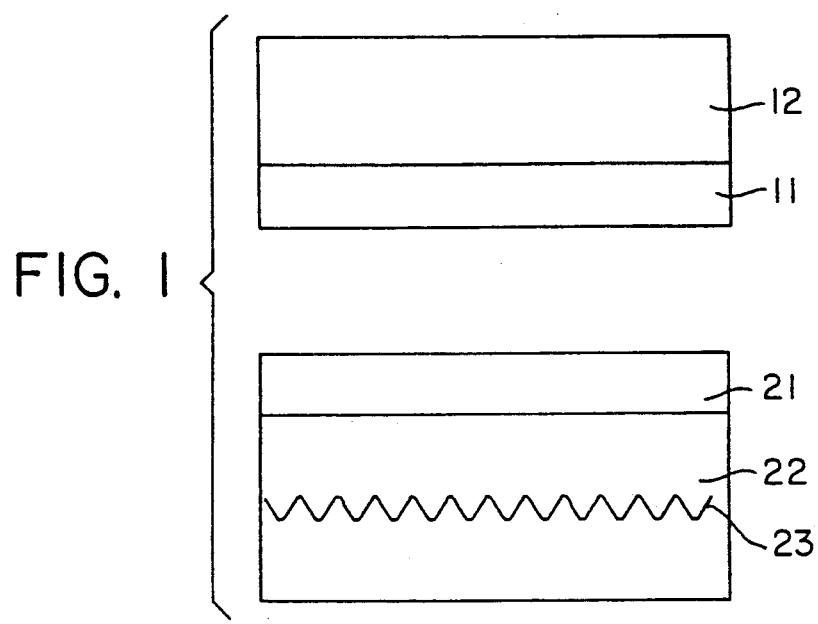
FIG. 1 shows the laminate components used to prepare an exemplary composite using the method of the invention.

The present invention takes advantage of the ability of unfused dispersion-polymerized PTFE to act as a pressure sensitive adhesive in the formation of PTFE-containing laminates. The unfused PTFE layer used as an adhesive may be substantially pure PTFE. The unfused PTFE may also contain substantial amounts (up to about 40% by weight) of metal, mineral, ceramic or carbonaceous fillers, such as talc or graphite. Graphite and other heat conductive fillers are particularly useful as they reduce the time needed at any given oven temperature to consolidate the unfused PTFE layer. The unfused PTFE layer may also contain up to about 40% by weight of polymeric modifiers, including fluoropolymers, both thermoplastic and elastomeric, such as copolymers containing tetrafluoroethylene (TFE), hexafluoropropylene (HFP), or perfluoropropyl or perfluoromethyl vinyl ether, homo and copolymers containing chlorotrifluoroethylene (CTFE), homo and copolymers containing vinylidene fluoride ($VF_2$), homo and copolymers containing vinyl fluoride (VF), and blends thereof. For example, terpolymers of $VF_2$, HFP and TFE may be used. Other polymeric additives can include hard polymers such as polyphenylene sulfide (PPS) and polyetheretherketone described in U.S. Pat. No. 4,610,918.

A noteworthy advantage of laminates containing both homopolymer and copolymer TFE in the bonding layer when made by the method invention is the ability to utilize the higher reactivity of the copolymer in the bonding layer with surfaces treated by amino silane or titanate coupling agents than the homopolymer. The bonds created between such treated surfaces and fluorpolymers, while exceptionally tenacious, are generally unstable at elevated temperatures, particularly in an oxidative environment. Thus, the very short residence time at elevated temperature and substantial exclusion of oxygen from the bonding layer accomplished during the low temperature phase of lamination according to the invention method lends itself exceptionally well to the making of laminates whose adhesion to surfaces such as metals, ceramics, and glass is substantially enhanced. Such laminates are of particular use in printed circuit, wire and cable, cookware, and bakeware applications.

A particular advantage of laminates in which the polymer in the bonding layer consists entirely of PTFE is that the fully developed bond is capable of use at higher temperatures than one consisting entirely of TFE copolymers, due both to the higher melting point of the homopolymer as well as its much greater resistance to flow (higher viscosity) at any temperature.

Furthermore, a bonding layer comprising a major portion of high melting homopolymer and a minor portion of copolymer(s) exhibits useful properties even above the melting point of the copolymer constituents due to the much greater resistance to flow of the blend. Bond layers comprising copolymer alone fail rapidly and catastrophically by delamination (adhesive failure) when peeled at an elevated temperature even below the copolymer melting point, whereas the bond comprised of a homopolymer and copolymer blend fails ultimately by loss of cohesive strength in the bonding layer well above the melting point of the copolymer constituent(s). And due to the much greater resistance to flow, the cohesive failure of the blend occurs at a much slower rate than the adhesive failure of the copolymer alone.

Yet another advantage of the invention method is its capability to accommodate tie-layers within a laminate component (such as a multilayer film) to make a well-bonded laminate containing polymers of disparate melting points and/or melt viscosities through the agency of unfused PTFE in a bonding layer. Such laminates include some which could otherwise be made only resorting to adhesive lamination such as in the case of a laminate comprising PVF (TEDLAR ®) film on at least one of its major surfaces. (See FIG. 9 and associated text).

As used in the specification and claims of this application, the term "unfused" PTFE refers to dispersion polymerized PTFE which has not been exposed to sufficient heat to cause any significant degree of melting. In the case that the unfused layer is formed from substantially pure PTFE or PTFE modified with additives that melt at higher temperatures than PTFE, this means that the PTFE-containing layer has not been exposed to temperatures in excess of 621° F., although it is preferred that the PTFE will not have been exposed to temperatures in excess of 590° F. Lower maximum temperatures are appropriate in the case of PTFE modified with other materials such as lower melting fluoropolymers or polymers with a glass transition temperature below the melting point of PTFE. Some heat exposure may, however, be necessary. For example, in the case where the unfused PTFE-containing layer is applied from an aqueous surfactant-containing dispersion the layer should be heated to a temperature sufficient to remove substantially all (e.g. >95%) of the water and thermally fugitive non-polymeric additives.

For use in the joining of two laminate components, one face of either or both of the laminate components is coated with unfused PTFE. This can be accomplished by dip-coating the laminate component in an appropriate PTFE-containing dispersion or by casting a layer of unfused PTFE onto the surface of the laminate component. The total thickness of the unfused PTFE is preferably fairly small, so that the amount of heat required to consolidate the unfused PTFE is kept as small as possible. Suitable total thicknesses are from 0.2 to 6.0 mils. It has been found, however, that all of the PTFE in a coated substrate used in the process as a laminating element may be unfused if the remainder of the laminate can tolerate the time at temperature required to complete fusion.

After the unfused PTFE layer or layers are in place, the two laminate components are placed in contact with one another. Because of the handling involved in this step, each of the laminate components should be reasonably dimensionally stable, i.e. self-supporting without substantial distortion. It will be recognized that materials which do not meet the criterion of being self-supporting when used in certain stressful conditions, can nevertheless be self-supporting under less stressful conditions. Thus the term dimensionally stable must be viewed in the context of a particular application of the method. Further if a particular laminate component would be too thin to meet this criterion, it can be formed on a carrier which is subsequently stripped from the final composite. The use of such a carrier may also be desirable to improve the quality of the outermost surface of the product laminate.

In the actual lamination process of the invention, the laminate is formed from the laminate components by two steps which separate the application of heat at a temperature above the melting point of PTFE and the requirement for the application of pressure. In the first of these steps, the laminate components are subjected to pressure at moderate temperatures to bring the surfaces into intimate contact and to form a mechanical bond. This can be effectively done using a nip-roll laminator or a calendaring machine.

Moderate temperature as used in the application refers to temperatures substantially below the melting temperature of the unfused PTFE in the bonding layer. Preferably, the temperature during the formation of a mechanical bond will be from about room temperature to about 400° F. More preferably, the temperature will be maintained between 85° F. and 350° F.

Pressures in the range of from about 25 psi to about 3500 psi are particularly suitable for use in the claimed invention. The particular amount of pressure required to form the mechanical bond between particular laminate components will depend on several factors; including the temperature, the thickness of the combined laminate components and the time period over which pressure is applied. Lower pressures are needed at higher temperatures, for thinner laminates, if the topography of the substrate is minimal, and if exposure time at pressure is greater. Higher pressure than that which is absolutely necessary for bonding may be desirable, however, if a highly regular surface is desired in the final product provided there is sufficient resin to produce such a surface. Further, the ability to keep the duration of the pressurization step brief makes the present invention particularly suited to a continuous process. In general, a bond can be formed under conditions such that the total time under pressure is less than 1minute, and frequently less than 1 second. For economic continuous operation, the preferred time at pressure will be less than about 15 seconds.

After the mechanical bond is formed, the bonded laminate components are sintered, preferably free-sintered, to consolidate the unfused PTFE-containing layer. Free-sintering means heating to a temperature in excess of the melting point of the unfused PTFE, e.g. about 641° F. at ambient pressure for a period of time sufficient to melt and consolidate the unfused PTFE. This step is preferably performed in an infrared oven to provide maximum thermal efficiency in the heating zones of the oven, although convectively heated ovens can also be used.

Because the actual level of adhesion between the two substrates in the intermediate laminate (i.e., subjected to pressure at modest temperature but not yet exposed to elevated temperature) is very low, the intermediate laminate is fragile and susceptible to delamination due to application of even modest forces capable of causing peel. The actual level of adhesion at this intermediate stage of the process is less than 2.0 lb/linear inch and frequently not much more than 0.2 lb/linear inch. A typical laminate has an adhesion strength of about 0.5 lb/linear inch. For this reason, the handling of the intermediate laminate prior to application of the high temperature required to fuse and fully develop much higher adhesion is important to the desired result of a final laminate characterized by uniformly high adhesion.

It is believed that the development of such a low level of adhesion at the intermediate stage is associated with the fact that the forces which develop adhesion at this stage are related to the tendency of unfused, dispersion polymerized PTFE to fibrillate under applied pressure. Since the force of the laminator or calendar is applied normal to the plane of the substrates being joined, minimal lateral forces are present to fibrillate the PTFE in the plane of the substrates being joined.

While pre-fibrillation of an unfused sheet of PTFE may be used to develop a bondable medium containing PTFE with more appreciable lateral strength, such strength is developed at the expense of the normal-directed fibrillation capacity of the unfused PTFE. This results in a less than maximal level of normally-directed fibrillation capacity and lower adhesion in the final laminate when consolidated at high temperature. Since adhesion in the normal direction is more crucial to the development of uniformly high adhesion in the final laminate, the invention method employs unfused PTFE in the bonding layer(s) which is believed to be fibrillated primarily by the application of force normal to the surfaces being joined.

It has been found, surprisingly, that by exercising adequate care in the handling of the modestly adhered intermediate laminate, one may avoid the development of peel forces deriving from mechanical or thermal shocks which results in a finished laminate after high temperature consolidation that has uniformly high levels of adhesion. This may be accomplished in a discontinuous or continuous mode although the continuous mode is preferred.

In the discontinuous mode, the intermediate laminate may be taken up as a roll so long as the forces induced during rolling do not initiate peeling, and so long as the thermally or thermo-mechanically induced forces associated with storage and handling prior to high temperature consolidation do not likewise initiate peeling.

Because the actual time of pressurization for the invention method is so brief, it lends itself well to continuous operation. And because the invention method does not require simultaneous application of elevated temperature and pressure, it avoids the equipment design problems related to generation and control of such conditions. Thus, continuous operation is facilitated in a setting of simple design and control features for the equipment such that continuous operation is actually preferred.

However, even in this preferred, continuous mode of operation, one must exercise care to avoid mechanical or thermo-mechanical shocks to the intermediate laminate to avoid delamination prior to high temperature consolidation. Equipment and process conditions must be consonant with this requirement. Considerations such as minimization of the number of rolls and their radius of curvature must be consistent with this requirement for any given laminate, and oven design for high temperature consolidation must minimize thermal shock prior to achievement of the temperature of final consolidation. The same consideration must be taken into account in selecting a suitable linear operating speed.

It is noteworthy that the invention method permits operating line speeds, even at minimal oven lengths, which do not require an accumulator between the low and high temperature portions of the process in most cases as a result of the very short interval of pressurization. This outcome is advantageous given the requirement for minimal mechanical forces which could initiate or exacerbate peel prior to high temperature consolidation.

Figure 10:
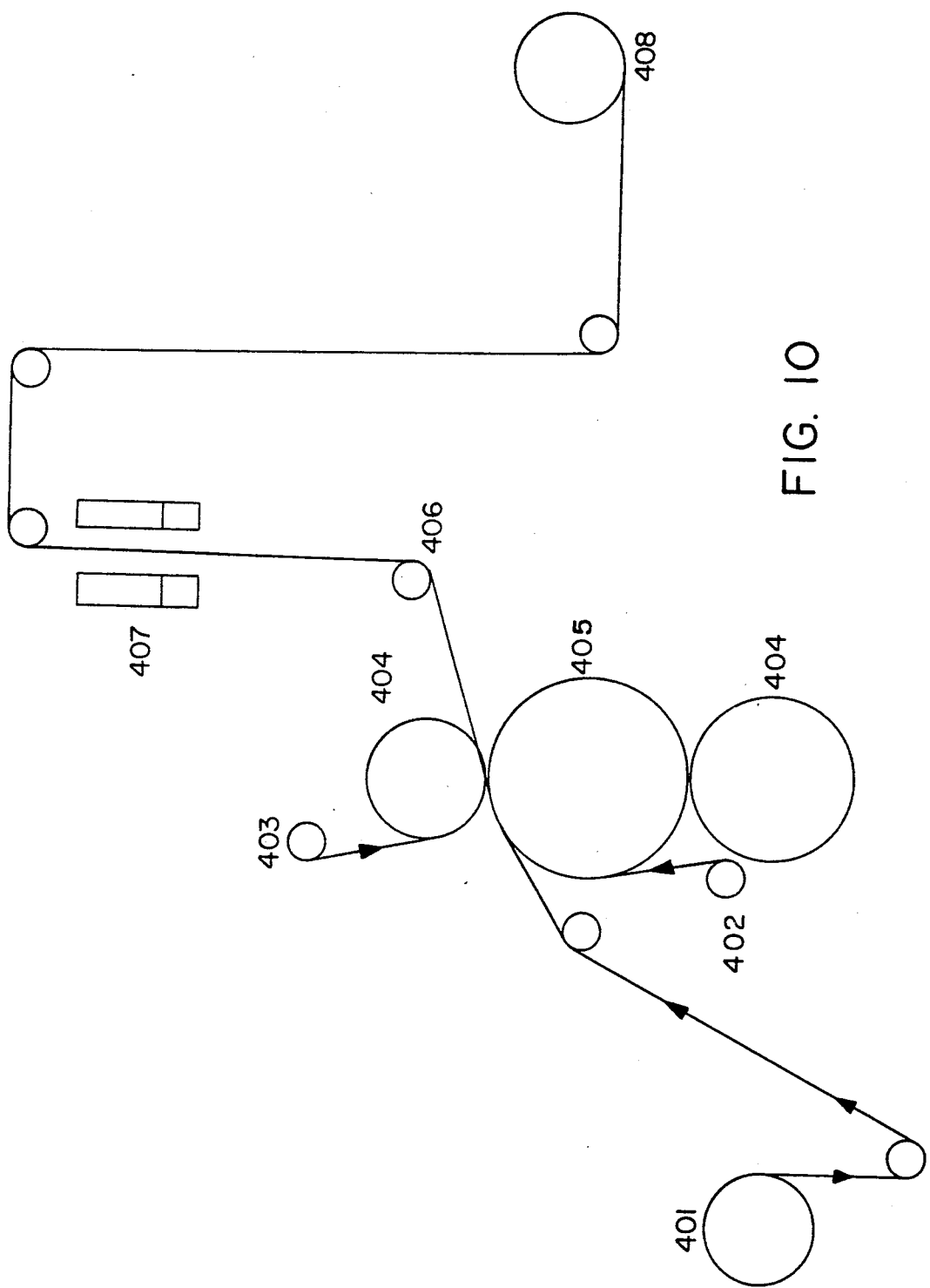
FIG. 10 is a schematic of an apparatus for use in carrying out the method of the invention.

A suitable apparatus for carrying out the process of the invention is shown schematically in FIG. 10. First, second, and third laminate components are supplied from pay off rolls 401, 402 and 403, respectively, and passed between a heated steel roll 404 and a packed roll 405 to form the intermediate mechanically bonded laminate. This intermediate laminate is turned by a single 4 ½ inch OD turn around roll 406 to pass vertically through a sintering oven 407. The consolidated final laminate is then handled conventionally and collected on take-up roll 408.

During preparation of various materials using the method of the invention, it was noted that blisters could form during the free-sintering process, indicative of delamination. This occurred on laminates prepared using a nip-roll laminator in which one roll, made of metal, was at a significantly higher temperature than the other roll which was made of packed cotton/wool fabric, and then subsequently placed in a tower which had both infrared and convection heating. In each case, the blistering occurred on the side which had been in contact with the lower temperature roll. It is believed that the blistering occurred due to differences in bonding strength between the consolidated PTFE and the first laminate component and the consolidated PTFE and the second laminate component caused by differences in the pressure and temperature exposure of the two sides of the material, and that these differences were accentuated by thermal shock upon entering the oven. It is therefore preferable to use comparable, although not necessarily identical, levels of pressure and temperature on the two sides of the product during formation of the mechanical bond to avoid internal gradients in bond strength. Further, it is preferable to use an oven with good temperature zone control to avoid thermal shocks.

FIGS. 1-9 illustrate various materials which can be made using the process of the invention. These figures demonstrate the utility of the invention in joining films to coated textiles, films to films and films to metals. It should be understood that these figures are exemplary only, however, and are not intended to limit the invention.

Looking first to FIG. 1, there is shown a material suitable for use as flexible cooking sheets, or for cooking conveyor belts. A first laminate component 1, formed from a layer of unfused PTFE 11 and a layer of sintered PTFE 12, is positioned over a second laminate component 2 formed from a layer of unfused PTFE 21 and a layer of woven fiberglass 23 coated with PTFE 22. These layers are joined using the process of the invention to form a composite 3. For use as cooking sheets, the inclusion of heat absorbing pigments or fillers in the sintered PTFE layer 12 and/or the unfused PTFE layer 11 will not only improve the efficiency of the consolidation step during processing, it is also desirable from the standpoint of the properties of the finished product. Such composites may also advantageously incorporate wear-resistant polymers such as polyphenylene sulfide in the sintered PTFE layer 12 and/or the unfused PTFE layer 11 to improve the durability of the product. Other wear-resistant materials and composites incorporating them are disclosed in U.S. Pat. No. 4,610,918 which is incorporated herein by reference.

Similar products useful in outdoor structural applications such as fabric structures, radomes, electromagnetic windows, glazing, and the like may be made from similar pairs of laminate components. Lower strength versions of this type of fabric find utility as protective liners or covers for vessels, pipes and fittings and electrolytic cells; as secondary containment vessels; and as ponds and ditch liners. In many cases, however, a wider product may be desired than that which is available using a particular coating/casting apparatus. Thus, it is significant to note that a number of first laminate components 1 can be overlapped across the width of a substrate 20 as shown in FIG. 3 to form a wider product.

Due to the more perfect state of consolidation of the composite, and in particular due to the elimination of surface defects due to a dip-coating process, such laminates are characterized by a higher contact angle to water than dip-coated fabrics making them particularly well suited to radome applications. It has been observed that the contact angles can actually increase over time outdoors to values approaching those associated with ice-ophobic as well as hydrophobic behavior.

Figure 2:
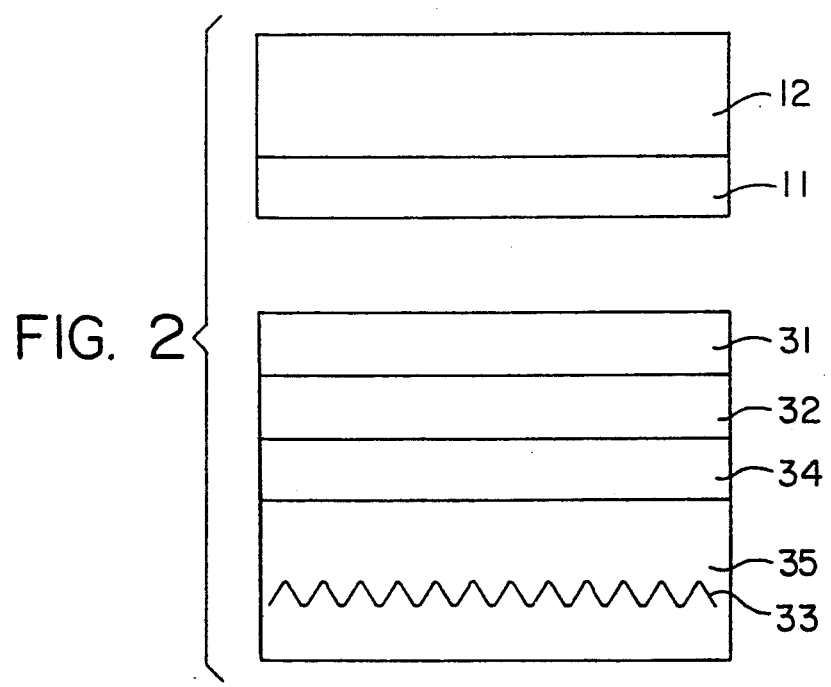
FIG. 2 shows the laminate components used to prepare an exemplary composite using the method of the invention.

FIG. 2 depicts a material which incorporates a fluoropolymer alloy. Alloys of this type are disclosed in U.S. Pat. No. 4,770,927, which is incorporated herein by reference. Again, the finished product is made by using a first laminate component 1 formed from a layer of unfused PTFE 11 and a layer of sintered PTFE 12. This is laminated to a second laminate component 3 formed from a layer of unfused PTFE 31, a layer of sintered PTFE 32, a layer of an alloy 34 containing, for example, 60% PTFE and 40% VF$_2$/HFP/TFE copolymer, and a layer of PTFE 35 having a woven glass substrate 33 embedded therein. The PTFE layer 35 can be sintered prior to lamination, or can itself be fused during the high temperature consolidation step. A product made as described above is highly suitable for use as chemically resistant expansion joints.

FIG. 4 shows another lighter material which incorporates a fluoropolymer alloy, but which has particular utility as a protective garment. Such materials may also be used as seals and gaskets. First laminate component 5 is formed from a layer of unfused PTFE 51 and a layer of a melt-bondable adhesive 52 such as perfluoroalkyl resin (PFA). The second laminate component 6 is formed from a layer of unfused PTFE 61, a layer of sintered PTFE 62, a fluoropolymer alloy layer 64 and a layer of PTFE 65 having a flexible woven or spun bonded textile 63 embedded therein. Particularly suitable textiles for use in protective garments are made from polyaramide fibers. Other materials of this type are described in U.S. Pat. No. 4,770,927 and U.S. patent application Ser. No. 06/734,977, which is incorporated herein by reference.

Figure 5:
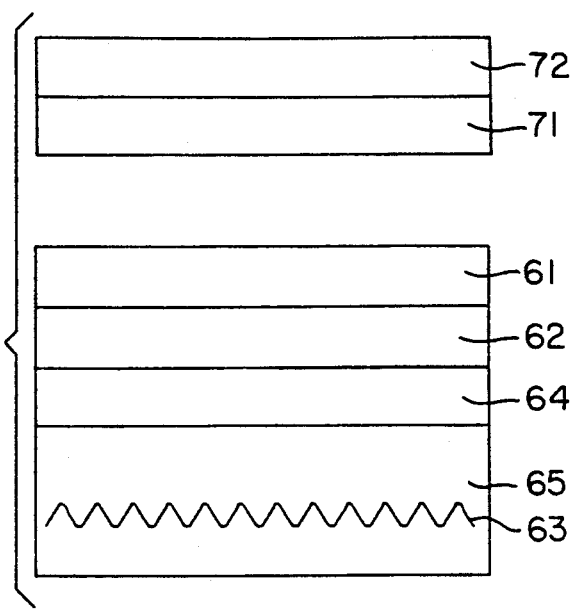
FIG. 5 shows the laminate components used to prepare an exemplary composite using the method of the invention.

FIG. 5 shows an alternative approach to making the composite of FIG. 4 and emphasizes a further aspect of the invention, i.e., the ability to provide a high quality PTFE-containing topcoat. In FIG. 5, the second laminate component 6 is the same as it was in FIG. 4. The first laminate component 7, however, is now formed from a layer of unfused PTFE 71 on a strippable carrier 72, for example an aluminum or polyimide carrier. After carrying out the two-step lamination process and stripping off the carrier, the product is a composite with a top-coat of PTFE. Other suitable carriers are discussed in U.S. patent applications Ser. Nos. 07/265,328 and 07/226,614, both of which are incorporated herein by reference. An outer layer of melt-bondable polymer serving as a thermally weldable adhesive can be applied to this composite by coating or casting to form the product of FIG. 4.

Figure 6:
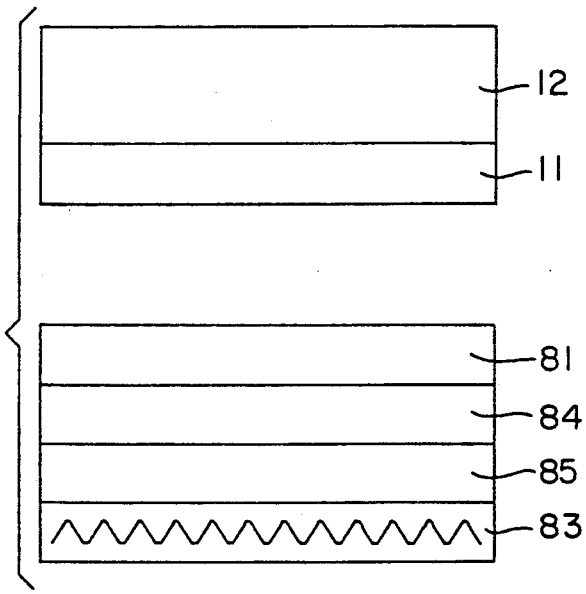
FIG. 6 shows the laminate components used to prepare an exemplary composite using the method of the invention.

FIG. 6 shows a composite in which one side of the composite is a heat sensitive fabric, such as cotton/polyester blends or nylon. Such a composite can be made from a first laminate component 1 formed from a layer of unfused PTFE 11 and a layer of sintered PTFE 12. This is joined to a second laminate component 8 formed from a layer of unfused PTFE 81, a layer of a fluoropolymer alloy 84 formed from PTFE and a thermoplastic terpolymer of HFP, $VF_2$ and TFE (TFB 7100D, Hoechst; mp=155° F.–180° F.; polymer density=1.98), a layer of the terpolymer 85 and the heat-sensitive fabric 83. In joining the two components, heat can be applied from one side only, i.e., the first laminate component side, to minimize the heat exposure of the fabric.

Figure 7:
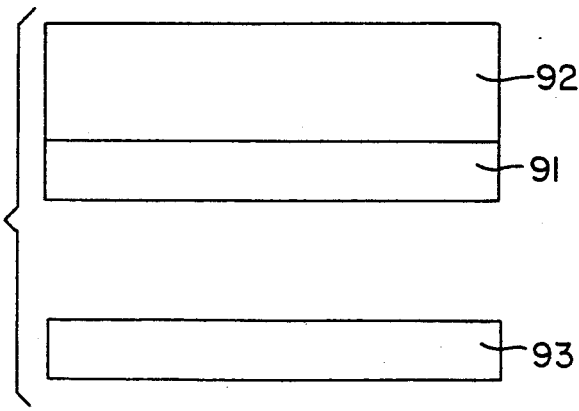
FIG. 7 shows the laminate components used to prepare an exemplary composite using the method of the invention.

FIG. 7 shows the use of the method of the invention in connection with making a coated metal. Here, a first laminate component 9 is formed from an unfused PTFE/FEP alloy layer 91 (>60% PTFE) and a layer of sintered PTFE 92. This is bonded to a second laminate component 93 which is amino-silane treated copper. Such a process could also be used to prepare PTFE coated metals for use as cookware or bakeware.

The method of the invention has been described thus far in terms of joining two laminate components together. The method can be used for joining three components as well. FIG. 8 shows the formation of a laminate from three laminate components: first and third laminate components 201 and 203 each formed from a layer of unfused PTFE 211 and 231 and a layer of sintered PTFE 212 and 232; and a second laminate component 202 formed from a layer of PTFE 225 having a supporting textile 223 embedded therein. The three components are assembled so that the unfused surfaces of the first and third components are in contact with the two major surfaces of the second component and pressure is applied to form a single interim mechanically bonded laminate which is then free sintered. Alternatively, the interim mechanically bonded laminate could be assembled in two steps, by successively joining the first and third components to the second. This latter approach eliminates the need to try to keep the three components in alignment during bonding, and avoids excessive heat exposure to a part of the materials, such as would result if three components were laminated in two successive steps using simultaneous heat and pressure.

FIG. 9 shows the formation of a three layer composite having a central layer of PTFE coated on both sides with polyvinylfluoride (PVF; TEDLAR ®) which ordinarily cannot be bonded to PTFE without using conventional adhesives (e.g. epoxies, isocyanates). The first laminate component 300 in this case is a film formed from a layer of sintered PTFE 302 coated on both major surfaces with a blend of unfused PTFE and PVF 301. This is contacted on both sides with a film 303 of polyvinylfluoride. These are joined by the method of the invention. If temperature sensitivity of the PVF is a significant factor, polymer alloy tie coat(s) with lower melting behavior can be used. For example, successive tie coats of FEP/PVF (fused) and PTFE (unfused) or a single PTFE/FEP/PVF tie coat (unfused) can also be used. A reverse laminate, i.e., PTFE coated PVF, could be used as a packaging material.

The invention will now be further described by way of the following nonlimiting examples.

EXAMPLE 1

A standard woven fiberglass fabric (Chemfab style 7628; weight=6.00 oz./sq. yd., thickness=6.8 mils, thread count (W×F)=44×32) was dip coated on one face with an aqueous PTFE dispersion containing 63.8% by weight of total solids, of which 10.6% was talc and 53.2% was PTFE (prepared from TEFLON ® T30B, DuPont). The preparation had a viscosity of 1760 cps (Brookfield RVT, #5 spindle, 50 rpm, 24.4° C.). The coating was applied to the fabric in two steps as shown in Table 1 to achieve a coated product with a finished weight of 9.04 oz./sq. yd. in which the outer portion of the PTFE was unfused.

A PTFE film was prepared by multilayer dispersion casting using TEFLON ® T30B. The film was formed in four layers as shown in Table 2 and had a total thickness of 1.40mils. Of this, the first three layers (1.15 mils) were sintered above 655° F. while the final layer (0.25 mil) was dried at 570° F. which left it in an unsintered condition.

A laminate was formed from the coated fiberglass and the PTFE film using a laminator. The laminator had one steel roll which was heated to a temperature of 300° F. and a wool cotton packed roll which was maintained at a temperature of 240° F. Two runs were made at line pressures of 800 psig and 1500 psig respectively at a roll speed of 10 ft./min. The hydraulic cylinders of the laminator were 4.75 inches in diameter and the width of the roll face was 42 inches with a ¾ inch nip impression. Assuming that the pressure was uniformly distributed across the face of the roll and onto the 20 inch wide laminated product, the line pressure translates to 675 PLI and 900 psi (800 psig line) and 1266PLI and 1688 psi (1500 psig line).

Sufficient adhesion of the film to the coated substrate was obtained as a result of compressing together the unsintered PTFE containing surfaces of the film and the coated fabric to allow thermal consolidation of the laminate by free sintering (no applied pressure) in an infrared oven. The final sintering operation was accomplished with IR emitter temperature settings of 900° F. at a line speed of 6ft./min. The length of the heating zone was 4 feet. The actual web temperature as measured with an optical pyrometer was 720° F.

The results of physical testing on the resulting laminate are shown in Table 3. The film adhesion was measured by taking an unbonded tab of film on part of the laminate and applying shear force to the film/coated fabric interface. It was not possible to pull the film off the fabric in this test before the film elongated and failed in tension. This indicates that excellent film to coated fabric adhesion had been achieved.

TABLE 1

| Preparation of Coated Fabric For Example 1 | | |
|---|---|---|
| | sintered pass | unsintered pass |
| Web speed (ft/min) | 8 | 4 |
| Dry Temperature (°F.) | 250 | 250 |
| Consolidation Temp. (°F.) | 680 | 580 |
| Composite Weight (oz/sq yd) | 7.91 | 9.04 |

TABLE 2

| Preparation of PTFE Film for Example 1 | | | | |
| --- | --- | --- | --- | --- |
| | layer 1 | layer 2 | layer 3 | layer 4 |
| speed (ft/min) | 18 | 18 | 18 | 5 |
| drying temp (°F.) | 250 | 250 | 250 | 250 |
| consolidation temp (°F.) | 700 | 700 | 700 | 570 |
| thickness (mils) | 0.50 | 0.35 | 0.30 | 0.25 |

TABLE 3

| Physical Properties of Laminate of Example 1 | | |
| --- | --- | --- |
| | | Test Methods |
| Thickness | 9.8 mil | FED STD 191-5030 |
| Weight | 11.3 oz./sq. yd. | FED STD 191-5041 |
| Tensile strength (warp) | 119 lb/in | FED STD 191-5102 |
| Tensile strength (fill) | 180 lb/in | FED STD 191-5102 |
| Trapezoidal tear (warp) | 12 lb | FED STD 191-5136 |
| Trapezoidal tear (fill) | 17 lb | FED STD 191-5136 |

EXAMPLE 2

A standard woven fiberglass (chemfab style 1080, weight = 1.43 oz./sq. yd., thickness = 2.0 mils, thread count (W×F) = 60×47) was dip coated with a single layer of an aqueous PTFE dispersion (TEFLON ® T30B, specific gravity = 1.45) at a web speed of 5 ft/min. The dip coated material was dried at 280° F. and then consolidated at 605° F. to provide a laminate component coated with unfused PTFE. The coated fabric had a final weight of 2.48 oz./sq. yd.

A two layer PTFE film was produced by dispersion casting using ALGOFLON ® D60 obtained from Ausimont as shown in Table 4. The initial layer was sintered at a temperature above 655° F., while the second layer was left unsintered.

A laminate was formed from the unfused PTFE-coated fiberglass by placing the unfused surface of a piece of the PTFE film in contact with each side of the coated fabric. The lamination process was performed on a laminator with one heated steel roll (300° F.) and one wool/cotton packed roll (240° F.). The line pressure of the laminator was 750 psig at a roll speed of 10 ft./min. The hydraulic cylinders of the laminator were 4 inches in diameter and the width of the roll face was 60.75 inches with a ¾ inch nip impression. Assuming the pressure was uniformly distributed across the face of the roll and onto the 20 inch wide laminated product, the line pressures translate to 300 PLI and 414 psig.

The resulting interim laminate had sufficient adhesion between the films and the coated fabric to allow the material to be free sintered (no applied pressure) in an infrared oven. This sintering process was carried out using an infrared emitter set at a temperature of 900° F. at a line speed of 6 ft./min. The actual temperature of the web was 720° F.

Physical testing on the final product revealed that it was superior to a comparable product (PTFE coated glass fabric of similar PTFE resin content), made by dip-coating. The comparative data are given in Table 5. The laminated product had a uniform blemish-free surface which is believed to contribute to the substantially improved dielectric strength which was observed.

TABLE 4

| Preparation of PTFE Film for Example 2 | | |
| --- | --- | --- |
| | layer 1 | layer 2 |
| speed (ft/min) | 25 | 5 |
| drying temp (°F.) | 250 | 250 |
| baking temp (°F.) | 680 | 580 |
| consolidation temp (°F.) | 710 | — |
| thickness (mils) | 0.50 | 0.3 |

TABLE 5

| Physical Properties of Laminate of Example 2 | | |
| --- | --- | --- |
| | laminate | comparative (dip coated) |
| Thickness (mil) | 3.5 | 3.0 |
| Weight (oz./sq. yd.) | 4.85 | 4.88 |
| Tensile strength (warp, lb/in) | 102 | 100 |
| Tensile strength (fill, lb/in) | 80 | 85 |
| Trapezoidal tear strength (warp, lb) | 6.3 | 5.1 |
| Trapezoidal tear strength (fill, lb) | 4.3 | 3.5 |
| Dielectric Strength (volts) | 4000 | 2500 |

EXAMPLE 3

DARLYN ® 1100, a commercial woven fiberglass composite produced by Chemical Fabrics which contains perfluoroplastic (PTFE) and fluoroelastomer (VF$_2$/HFP/TFE terpolymer) was coated on one of its major sides with PTFE dispersion. It was subsequently consolidated at 600° F.–605° F., below the melting point of PTFE but above the temperature required to essentially eliminate surfactants and water from the added coating. The added PTFE from this process was 4.7 oz/yd$^2$ resulting in a total weight of 67.2 oz/yd$^2$ for the coated composite, and provides an unfused PTFE content equivalent to an average thickness of 2.9 mils on one face of the initial DARLYN ® 1100. TEFLON ® TE-3313 dispersion was used to provide the added PTFE.

A PTFE film was prepared in a multilayer casting process so that the last two of the five PTFE layers were unfused while the first three were fused. This resulted in a film consisting of 2.0 mils of fused PTFE with 0.8 mils of unfused PTFE on one of its major faces. ALGOFLON ® D-60 PTFE dispersion was used to produce this film, the unfused PTFE was consolidated at 600° F.

Finally, a laminate was produced from the unfused PTFE coated composite and the partially fused PTFE film mentioned above by bringing together the unfused faces of each at 3072 psi and 300° F. in a continuous laminator operating at 14 feet/min. The full force due to a line pressure of 1300 psig on the laminator rolls was applied to a 20 inch wide laminate resulting in sufficient adhesion, due to the consolidation of the unfused PTFE at modest temperature, to permit free sintering of the laminate at 680° F. in a convective heating oven with a sintering zone length of 8 ft. at 4 fpm; i.e., a residence time of only 2.0 minutes at sintering temperature. The laminated web was preheated for 2.0 minutes at 250° F. to avoid thermal shock to this thick (54.3 mil) preformed laminate before it entered the sintering zone for high temperature consolidation.

The final product, laminated and fully fused, exhibited excellent properties suitable for use in high temperature corrosive environments. Importantly, this process eliminates the need for copolymer thermoplastic materials otherwise used to produce a film/coated fabric laminate. Such copolymers are both more costly and offer a lower continuous end-use temperature. These latter copolymer derived laminates are more prone to delamination at temperatures approaching the lower melting point of such copolymers than the invention composite.

TABLE 6

| Properties of Finished Laminate of Example 3 | |
|---|---|
| Weight (oz/yd$^2$) | 71.4 |
| Thickness (.001") | 54.3 |
| Tensile Strength (lb/in) | |
| Warp | 1669 |
| Fill | 1168 |
| Tensile Strength after flexing (lb/in) | |
| Warp | 1487 |
| Fill | 1203 |
| Tear Strength (lb) | |
| Warp | 225 |
| Fill | 243 |

It is particularly notable that the tensile strength of the fill yarns in the laminated composite are essentially unaffected upon flexing and that the warp yarns retain about 90% of their tensile strength upon flexing. (Flexfold test method.)

EXAMPLE 4

A five layered, 2.8 mil PTFE film was prepared using ALGOFLON ® D60 PTFE dispersion from Ausimont to produce a multi-layered film by a casting process. The fused portion of the film consisted of three layers of PTFE with an overall thickness of 2.0 mils. The remaining two layers consisted of unsintered PTFE on one face of the film only, with an overall thickness of 0.8 mil.

A series of experiments were conducted to determine the pressure necessary to yield an intermediate laminate (i.e., formed at modest temperature) of film to film, having sufficient mechanical adhesion, for final consolidation under free sintering conditions. Two 3.5"×4.5" samples of the film were placed into a 300° F. heated platen press, with the unsintered PTFE faces of the film in contact, over a pressure range of 5–70 psig for 5 seconds. The press platen size was 3.5"×4.5" and had a 3" bore hydraulic cylinder; thus the actual pressure on the films can be calculated using the following formula:

$$P = \frac{\text{(gauge pressure)}(\text{area hydraulic cylinder})}{\text{area of platen}} = \text{actual laminate pressure}$$

The actual pressure and the associated film/film bond integrities are indicated in Table I.

It was observed that at a pressure of 55 psig (or 24.7 psi) the resulting film to film laminate developed sufficient mechanical adhesion to produce a fully consolidated laminate upon a subsequent free sintering operation. The final consolidation was accomplished using a convection oven at 720° F. with a 30 second residence time.

All five laminates were prepared using the same time under any given pressure during lamination, and the same time and temperature for final consolidation by free sintering. Each was then evaluated for adhesive strength by attempting to separate an unbonded tab from the consolidated laminate. The results indicate that at 55 psig (24.7 psi) there was excellent film integrity, and at 50 psig (22.4 psi) there was fair integrity. At lower pressures, film/film integrity was noticeably poorer using only 5 seconds for the initial low temperature lamination (unsintered), and only 30 seconds for the final thermal consolidation (sintered). At 55 psig the film/film laminate when sintered exhibited a tensile strength greater than the yield strength of the film, i.e., it contained a cohesively destructive bond at the film/film interface.

TABLE 7

| Gauge Pressure (psig) | Actual Laminate Pressure[1] (psi) | Bond Integrity After Sintering at 720° F. |
|---|---|---|
| 5 | 2.2 | poor |
| 25 | 11.2 | poor |
| 50 | 22.4 | fair |
| 55 | 24.7 | excellent |
| 70 | 31.4 | excellent |

[1]Lamination conducted at 300° F./5 seconds.

EXAMPLE 5

A standard woven fiberglass fabric (CHEMFAB style 116: weight-3.16 oz/yd$^2$, thickness-3.8 mils, count 60×58 (w×f) was dip-coated in a series of operations to provide a coated composite containing PTFE perfluoroplastic and fluoroelastomeric terpolymer (VH$_2$/HFP/TFE). This dip-coated article was subsequently coated on both sides with a dispersion containing 90 weight % PTFE and 10 weight % PFA of fluoroplastic solids at a formulation specific gravity of 1.43. This final coat was dried at 350° F. and baked at 510° F. so that the PTFE in this topcoat remained unfused. The total weight of this baked composite was 9.69 oz/yd$^2$ of which 0.92 oz/yd$^2$, was the unfused PTFE surface at a thickness of 0.3 mils on each face. This constituted what is later referred to as laminate component A.

Laminate component B, was separately formed by a multi-layer film casting method so that a seven layer film resulted with an overall thickness of 1.9 mils. The central, 5 layered core contained 90 weight % PTFE and 10 weight % of PFA with regard to its polymeric constituents; this central core also contained 8 weight % based on total solids of inorganic pigments. One of the outer layers (that used as the mating face to laminate component A above in subsequent processing) consisted of 0.4 mils of a blend of PTFE (90weight %) and PFA (10 weight %) which was baked at about 550° F.; i.e., below the fusion temperature if PTFE. The other face of this multi-layer film consisted of 0.2 mils of PFA in a fully fused state.

Laminate components A and B above were combined in the nip of a calendar (nip impression of ¾") at 2030 psi and 175° F. so that the unfused PTFE containing faces of each were in intimate contact. It was found that this temperature and pressure resulted in sufficient adhesion of the intermediate laminating elements to each other so that it could be passed over a 4 ½" OD roll to change the direction of travel from horizontal to vertical without visual evidence of delamination. The vertically travelling web passed directly into a 30" length of oven at a line speed of 5.6 fpm so that it could be fused at about 675° F. without delamination. Table 8 defines the time, temperature, and pressure conditions of this two phase lamination. Properties of the finished, fully consolidated laminate are shown in Table 9. Inspection of the laminate indicated that the peel strength of the film from the coated substrate undergoes a sharp transition from poorly bonded to strongly bonded at the point of transition from unfused PTFE to fused PTFE at the interface. The final composite is noticeably more supple than an otherwise similar composite made by using a copolymer of TFE as a melt adhesive. The composite of this example was made by an in-line, continuous operation with good efficiency and yielded excellent product well suited to protective clothing and chemically resistant liner applications.

TABLE 8

Processing Conditions for Lamination/Thermal Consolidation for Example 5; Two Phase: Low Temp/High Pressure and High Temp/Ambient Pressure (In-Line, Continuous)

| | Temperature (°F.) | Pressure (psi) | Time (seconds) |
|---|---|---|---|
| Phase I | 175–185 | 2230 | 0.67 |
| Phase II | 675 | Ambient (free-sintered) | 27 |
| Other Processing Conditions: | | | |
| Upper Roll | polished, chromed steel | | (185° F.) |
| Central Roll | cotton/wool packed | | (175° F.) |
| Lower Roll | polished, chromed steel | | (300° F.) |
| Line Speed | 5.6 fpm | | |

TABLE 9

Physical Properties of the Laminate of Example 5

| Property | Units | Value | Method |
|---|---|---|---|
| Weight | oz/yd$^2$ | 15.7 | ASTM D751 |
| Thickness | mils | 10.8 | ASTM D751 |
| Tensile Strength | | | |
| warp | lb/in | 238 | FTMS 191A (Method 5102) |
| fill | lb/in | 234 | FTMS 191A (Method 5102) |
| Flexfold Strength | | | |
| warp | lb/in | 167 | FTMS 191A (Method 5102) |
| fill | lb/in | 147 | FTMS 191A (Method 5102) |
| Trapezoidal Tear Strength | | | |
| warp | lb | 9.6 | FTMS 191A (Method 5136) |
| fill | lb | 11.1 | FTMS 191A (Method 5136) |
| Stiffness | mg-cm | 14000 | ASTM D-1388-84 |
| Seam Adhesion (coating to substrate) | lb | 4.5 | LAM 5200 LP-62 |
| Film Adhesion (film to substrate) | lb | Bond stronger than film | CFP 81585L-1 |
| Burst Strength | psi | 525 | FTMS 191A (Method 5122) |

The peel adhesion of the film element to the coated substrate element of the laminate of Example 5 has been examined in some detail as a function of the actual process time during which the critical events of this process occur, i.e., development of its initially modest adhesion and its final well developed high adhesion.

As indicated in Table 8, the initial modest adhesion is developed in 0.67 seconds at 2230 psi and 175° F.–180° F. The actual level of adhesion developed between the laminating elements at this point in the process is about 0.4–0.8 lb/inch.

This intermediate laminate is then conveyed to a heating zone where the temperature of at least the bonding layer is elevated from 175° F. to 675° F. over a total interval of about 27 seconds as indicated in Table 8.

However, during that interval, the peel adhesion increases in discernible steps indicative of their nature and, by deductive reasoning, of the temperature associated with them. The adhesion level remains constant for a brief interval as the temperature of the bonding layer rises. It then rises steadily to about 1.8 lb/inch over an interval of a few seconds. Because such a rise is not observed in the absence of the PFA copolymer in the bonding layer comprising unfused PTFE, it is reasonable to conclude that the physical event associated with this rise is attributable to the melting of PFA at about 575° F.–590° F. and subsequent flow as the temperature of the bonding layer increases further to that at which melting of the unfused PTFE occurs (641° F.). It should be noted that PFA is not essential to the development of the much higher adhesion which is developed once the PTFE melts and sinters.

In the absence of PFA in the bonding layer, it is regularly observed that a very small increase in adhesion level occurs, amounting to about 0.5 lb/in, achieving a brief plateau in adhesion for an interval of about 0.45 seconds. This is believed to be associated with the melting of the PTFE itself in the bonding layer at 641° F. since it is followed immediately by a sharp rise in adhesion to about 4–5lb/inch, the well developed final level of adhesion of the entire coating to the fiberglass reinforcement in the substrate. This latter event occurs in about 1.3 second representing the elimination of interparticulate voids as the melted PTFE sinters.

It is clear from this description that the most critical thermal events responsible for successful lamination, melting and sintering of the initially unfused PTFE occur in the very short interval of less than two seconds between 641° F. and 675° F. It is equally clear that the development of sufficient initial adhesion at modest temperature under pressure occurs in the even shorter interval of 0.67 seconds. Thus, in the total brief interval of about 28 seconds of this entire process, the most critical phenomena occur in the very short interval of about 3seconds.

It will be clear to one skilled in the art that the total interval of processing could be substantially shortened by employing heating methods which deliver the process heat more directly to the bonding layer itself through the incorporation of selective absorbers into the bonding layer, or alternatively reflectors to protect thermally sensitive elements, along with appropriately selected radiant energy sources.

It will be equally clear to one skilled in the art that the short interval, thermo-chronic processing of the invention method makes it amenable to the combining of PTFE with other polymers in either laminating element or in a textile reinforcement which could suffer substantial loss of inherent properties if processed by more ordinary, longer interval processing methods.

We claim:

1. A laminated article characterized by improved bonding and adhesion prepared by the method of:
    (a) preparing a first dimensionally stable laminate component having two major surfaces, at least one of said major surfaces having an exposed layer comprising unfused polytetrafluoroethylene;
    (b) preparing a second dimensionally stable laminate component having two major surfaces, at least a first of said major surfaces being capable of forming an integral bond with the unfused polytetrafluoroethylene containing layers;
    (c) thereafter continuously bringing said first and second laminate components together so that the exposed layer comprising unfused polytetrafluoroethylene and the surface bondable with the unfused polytetrafluoroethylene-containing layer are in contact with each other;

(d) applying pressure to the combined laminate components at moderate temperature to achieve intimate contact and form a mechanical bond between the first and second laminate components;

(e) introducing the mechanically bonded laminate to a heating zone under conditions which do not cause delamination; and (f) sintering the mechanically bonded laminate components in the heating zone to consolidate the unfused polytetrafluoroethylene-containing layer.

2. A laminated article according to claim 1, wherein said first major surface of said second laminate component has an exposed layer comprising unfused polytetrafluoroethylene.

3. A laminated article according to claim 1, wherein the mechanically bonded laminate components are free sintered.

4. A laminated article according to claim 1, wherein at least one of said laminate components is an unreinforced film.

5. A laminated article according to claim 1, wherein said unfused polytetrafluoroethylene layer comprises as least 60% polytetrafluoroethylene by weight.

6. A laminated article according to claim 5, wherein the unfused polytetrafluoroethylene layer further comprises fillers.

7. A laminated article according to claim 5, wherein the unfused polytetrafluoroethylene layer further comprises up to 40% by weight of non-polytetrafluoroethylene polymers.

8. A laminated article according to claim 7, wherein the non-polytetrafluoroethylene polymers are selected from the group consisting of fluoroelastomers, fluoroplastics, and hard polymers.

9. A laminated article according to claim 1, wherein the laminate components are mechanically bonded at a pressure of from 25 to 3,500 pounds per square inch at a temperature less than 400° F.

10. A laminated article according to claim 9, wherein the laminate components are mechanically bonded at a temperature of from 70° F. to 350° F.

11. A laminated article according to claim 1, wherein said first laminate component further comprises a layer of sintered polytetrafluoroethylene not covering the unfused PTFE layer.

12. A laminated article according to claim 11, wherein the mechanically bonded laminate is free sintered.

13. A laminated article according to claim 11, wherein the layer of sintered polytetrafluoroethylene is contact with the exposed layer of unfused polytetrafluoroethylene.

14. A laminated article according to claim 13, wherein said second laminate component comprises a layer of polytetrafluoroethylene-coated textile which is not in direct contact with the first laminate component during the lamination process.

15. A laminated article according to claim 14, wherein the second laminate component further comprises an exposed layer of unfused polytetrafluoroethylene which is in direct contact with the first laminate component during the lamination process.

16. A laminated article according to claim 14 wherein the exposed layer of unfused polytetrafluoroethylene in the second laminate component is in contact with the polytetrafluoroethylene-coated textile.

17. A laminated article according to claim 14 wherein the first laminate component further comprises polyphenylene sulfide.

18. A laminated article according to claim 14, wherein the textile is glass, polyaramide, or high temperature polyamide fabric.

19. A laminated article according to claim 18, wherein the second laminate component further comprises an alloy layer comprising a blend of at least two fluoropolymers disposed between the polytetrafluoroethylene-coating textile and the unfused polytetrafluoroethylene-containing layer.

20. A laminated article according to claim 19, wherein the second laminate component further comprises a layer of sintered polytetrafluoroethylene disposed between the alloy layer and the unfused polytetrafluoroethylene-containing layer.

21. A laminated article according to claim 1, wherein the first laminate component further comprises a layer of a melt-bondable adhesive material exposed on the second major surface.

22. A laminated article according to claim 21, wherein the layer of melt-bondable adhesive material is in contact with the exposed layer of unfused polytetrafluoroethylene.

23. A laminated article according to claim 21 wherein said second laminate component comprises a layer of polytetrafluoroethylene-coated textile which is not in direct contact with the first laminate component during the lamination process.

24. A laminated article according to claim 23, wherein the second laminate component further comprises an exposed layer comprising unfused polytetrafluoroethylene which is in direct contact with the first laminate component during the lamination process.

25. A laminated article according to claim 24, wherein the exposed layer of unfused polytetrafluoroethylene in the second laminate component is in contact with the polytetrafluoroethylene-coated textile.

26. A laminated article according to claim 24, wherein the second laminate component further comprises an alloy layer comprising a blend of at least two fluoropolymers disposed between the polytetrafluoroethylene-coated textile and the unfused polytetrafluoroethylene-containing layer.

27. A laminated article according to claim 26, wherein the second laminate component further comprises a layer of sintered polytetrafluoroethylene disposed between the alloy layer and the unfused polytetrafluoroethylene-containing layer.

28. A laminated article according to claim 27, wherein the melt-bondable adhesive is a perfluoroalkyl resin.

29. A laminated article according to claim 28, wherein the textile is a flexible woven or spun-bonded material.

30. A laminated article according to claim 29, wherein the textile is made from polyaramide fibers.

31. A laminated article according to claim 1, wherein said second laminate component comprises a metal layer which is not in direct contact with the first laminate component during the lamination process.

32. A laminated article according to claim 31, wherein the metal layer is amino-silane treated copper.

33. A laminated article according to claim 31, wherein the second laminate component further comprises a tie-layer selected from among perfluoroalkyl resin, polychlorotrifluoroethylene, fluorinated ethylene propylene copolymer and a blend of fluorinated ethylene propylene copolymer and polytetrafluoroethylene.

* * * * *